(12) United States Patent
Cummings

(10) Patent No.: US 11,156,648 B2
(45) Date of Patent: Oct. 26, 2021

(54) RADIO SIGNAL ABSORPTION TESTING ENCLOSURE

(71) Applicant: T-Mobile USA, Inc., Bellevue, WA (US)

(72) Inventor: Oscar Ramses Cummings, Seattle, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 267 days.

(21) Appl. No.: 16/237,041

(22) Filed: Dec. 31, 2018

(65) Prior Publication Data
US 2019/0331719 A1    Oct. 31, 2019

Related U.S. Application Data

(60) Provisional application No. 62/662,657, filed on Apr. 25, 2018.

(51) Int. Cl.
| | | |
|---|---|---|
| *H04B 17/00* | (2015.01) | |
| *G01R 29/08* | (2006.01) | |
| *H04B 17/30* | (2015.01) | |
| *H04B 17/16* | (2015.01) | |
| *G01R 31/28* | (2006.01) | |
| *H04B 17/29* | (2015.01) | |

(52) U.S. Cl.
CPC ..... *G01R 29/0821* (2013.01); *G01R 29/0878* (2013.01); *G01R 31/2822* (2013.01); *H04B 17/0085* (2013.01); *H04B 17/16* (2015.01); *H04B 17/29* (2015.01); *H04B 17/30* (2015.01)

(58) Field of Classification Search
CPC ............ G01R 29/0821; G01R 29/0878; G01R 31/2822; H04B 17/29; H04B 17/0085; H04B 17/30; H04B 17/16
See application file for complete search history.

(56) References Cited

U.S. PATENT DOCUMENTS 8,295,777 B1 * 10/2012 Yenney ................. H04W 24/06
                                                       455/67.12
9,398,466 B1    7/2016 Joung et al.
(Continued)

FOREIGN PATENT DOCUMENTS

CN         205986892 U       2/2017

OTHER PUBLICATIONS

English Translation of Li et al., Radio Frequency Transceiver Front End Test Table, 2017 ( Year 2017).
(Continued)

*Primary Examiner* — Dieu Hien T Duong
(74) *Attorney, Agent, or Firm* — Lee & Hayes, P.C.

(57) ABSTRACT

A radio signal absorption enclosure can be used while testing wireless communication devices. In some examples, the radio signal absorption enclosure includes at least two conductive radio frequency (RF) shield layers separated by an insulator material. An inner surface of the RF shield can be further lined with a RF absorbing material to attenuate the electro-magnetic radiation generated within the radio signal absorption enclosure. In some examples, components internal to the radio signal absorption enclosure, such as a rotatable platform and a controller, can receive power and/or instructions via a filter, thereby substantially reducing electro-magnetic interference and/or RF interference.

20 Claims, 5 Drawing Sheets

(56) References Cited

U.S. PATENT DOCUMENTS

2013/0033279 A1* 2/2013 Sozanski ............ G01R 29/0821
  324/750.27
2014/0091874 A1* 4/2014 Cook ...................... H01P 1/203
  333/12
2015/0137829 A1   5/2015 Ho
2019/0004102 A1* 1/2019 Gienger ............... G01R 29/105
2019/0235003 A1* 8/2019 Paulsen ................. G01R 29/10
2019/0331720 A1  10/2019 Cummings
2019/0391195 A1* 12/2019 Kvarnstrand .......... H04B 17/15

OTHER PUBLICATIONS

Office Action for U.S. Appl. No. 16/237,080 dated Mar. 3, 2021, Cummings, "Testing Bench", 9 Pages.

* cited by examiner

ABSORPTION TESTING ENCLOSURE

CROSS REFERENCE TO RELATED APPLICATIONS

This patent application claims priority filing benefit from U.S. Provisional Patent Application No. 62/662,657, filed Apr. 25, 2018, which is hereby incorporated by reference, in its entirety.

FIELD OF THE DISCLOSURE

The present disclosure relates generally to testing telecommunications devices and, more particularly, this disclosure relates to a testing system for performing Radio Access Network testing protocols on telecommunications devices emitting high-frequency radio waves within an enclosure.

BACKGROUND

The electronics industry is a dynamic industry where new products are continually being released and implemented for use by consumers in the marketplace. These consumers expect new products to increase in speed and efficiency relative to previously introduced products. In order to increase the speed and/or efficiency of a telecommunications device, the telecommunications device may operate on a Radio Access Network (RAN) that specifies a frequency that is in a higher-level frequency band (e.g., millimeter wave spectrum) different than traditional wireless handheld devices.

Before a product (e.g., a device, system, software, and/or hardware) is implemented in the market or made available for consumption, the product often undergoes validation testing to ensure that the product is fully functional with the software and hardware, operational, and safe to use upon deployment. The testing may be used to measure durability, battery performance, application performance, communication performance, software features, or other quantifiable aspects of the operation of the electronic device subjected to the testing.

Traditional testing platforms are configured to test wireless devices that operate on a RAN that specify frequencies in traditional low and middle frequency bands (e.g., 2G, 3G, 4G and WiFi). These traditional platforms include using conductive (e.g., wired testing) or Over the Air (OTA) testing between the telecommunications device and the radio (e.g., gNB or eNB) providing the RAN for the wireless validation testing.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
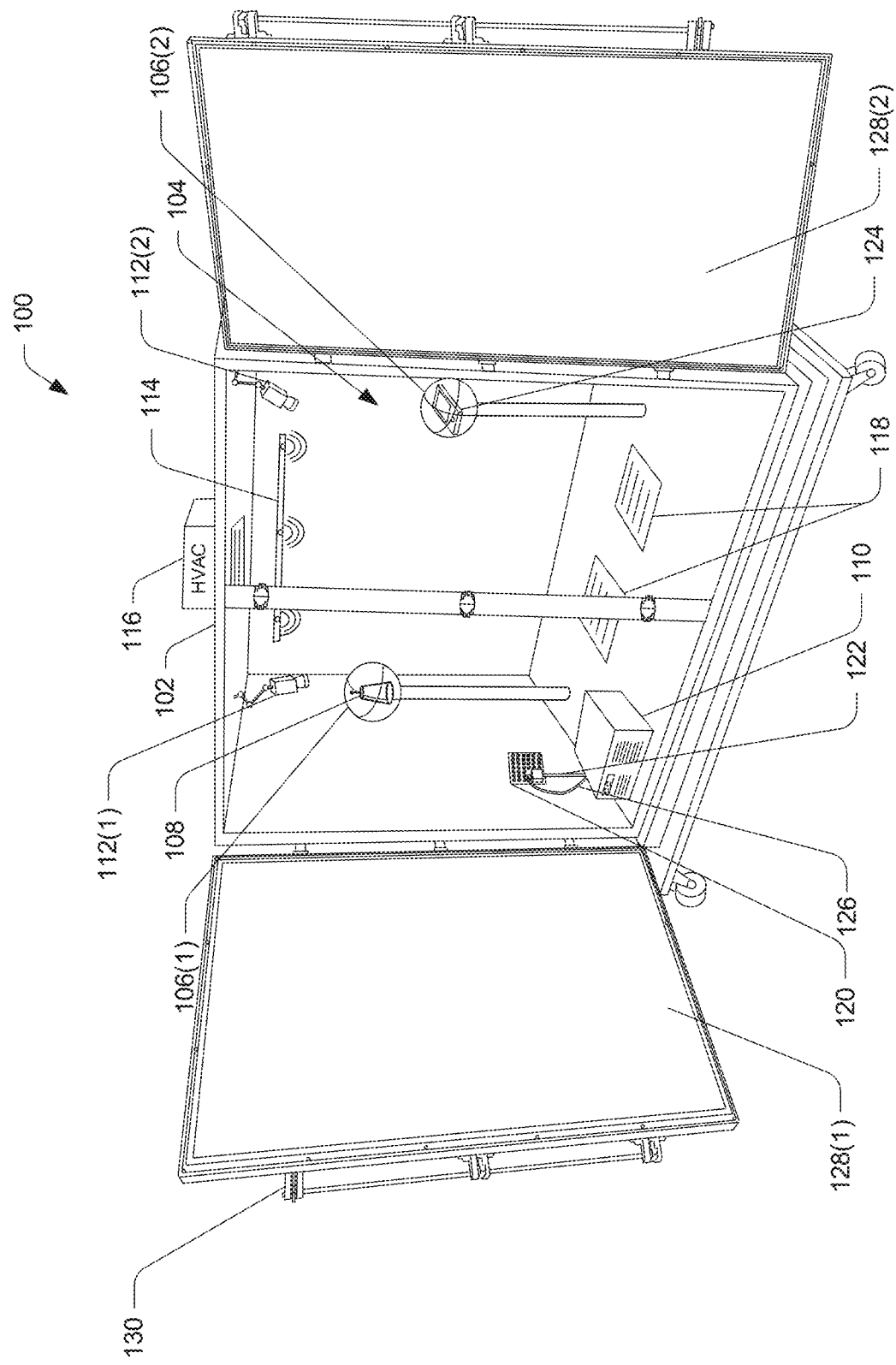
FIG. 1 illustrates an overview of an exemplary radio signal absorption testing enclosure system, in accordance with various implementations of the disclosure.

A radio signal absorption testing enclosure system may be used to perform repeatable testing of a device, such as a telecommunications device (herein referred to as user equipment (UE)), and a radio as the UE communicates using a high-level frequency band provided by the radio. New UEs that utilize radio access networks that specify frequencies that are in a higher-level frequency band (e.g., 5G) may need to communicate with radios that are unable to be tested using conductive methods due to the propagation properties of the high-level frequencies and because of the number of antennas included in the radio. Because these UEs and radios cannot be tested using conductive methods, they instead need to be tested over the air (i.e., not using wired testing). It is therefore desirable to test the UEs and the radios in a radio signal absorption enclosure so that the emitted radio signals due not interfere with the results of the test and because the high frequency radio signals may be harmful to a tester if not properly shielded. For example, such a radio signal absorption enclosure testing system can be used to test UEs and radios operating in accordance with $5^{th}$ Generation (5G) frequencies, including millimeter-wave frequencies (e.g., approximately 24 GHz-70 GHz), although any frequencies can be tested in accordance with aspects of the disclosure.

By way of example, and without limitation, the radio signal absorption enclosure testing system can include rotatable platforms, filters, cameras, vents, controllers, an HVAC system, and interior walls lined with a material designed to absorb RF signals. During a testing protocol, a radio (e.g., a 5G radio such as a gNodeB) and a user equipment can be placed into the radio signal absorption enclosure, whereby various operations of the UE and/or of the radio can be initiated thereby causing the UE and the radio to communicate with one another. The operations in the testing protocol may include, without limitation, initiating voice calls, transmitting and receiving data (messages, videos, music, etc.), executing applications, browsing the Internet, and performing other operations. By initiating operations within the radio signal absorption enclosure such as those described above with respect to the testing protocol, the UE may be tested in a laboratory environment (e.g., with minimal interference from reflected radio signals and/or from external devices) using an automated process and include quick cycle times, improving efficiency and repeatability. Results of the testing protocols may be captured and analyzed to determine performance of the UE and/or the radio, which may be compared to threshold performance metrics or used for other purposes.

The testing protocols may be performed within a radio signal absorption enclosure which absorbs the radio signals emitted by the radio such that the radio signals do not interfere with or otherwise affect the results of the testing protocols. Additionally, some radios may include well over 100 antennas elements (and in some cases may include 512 antennas elements or more) with varying polarizations that may be tested using multiple ports for each antenna and/or polarization combination. Having a dedicated port on the radio for conductive testing of each antenna would be an impractical solution because the radio may not have enough surface area to support individual physical ports. Therefore, it may be beneficial to test the radio over the air (OTA) and to perform the test within a radio signal absorption enclosure which absorbs the radio signals emitted by the radio such that the radio signals do not interfere with or otherwise affect the results of the testing protocols.

During a testing protocol being performed within the radio signal absorption enclosure, the radio and/or the UE may be coupled to a rotational platform within the radio signal absorption enclosure that may enable the radio and/or the UE to be maneuvered from outside the radio signal absorption enclosure. Additionally, a filter may be housed in the radio signal absorption enclosure and coupled to the radio and/or the UE to provide power and/or instructions to perform operations such that the filter removes or dampens any RF energy resulting from electrical current transfer but that does not carry data, such as from a power supply.

The systems, devices, and techniques described herein can be implemented in several ways. Example implementations are provided below with reference to the following figures. It should be appreciated that the subject matter of the disclosure can be reasonably modified, rearranged, or otherwise altered, in accordance with embodiments of the disclosure.

FIG. 1 illustrates an overview of an exemplary radio signal absorption testing system 100 that includes a radio signal absorption enclosure 102 having a plurality of walls defining an interior region 104 thereof. The radio signal absorption enclosure 102 may include an anechoic chamber configured to reduce reflections and echoes of RF signals emitted inside of the radio signal absorption enclosure 102 by absorbing the RF signals. The system 100 includes a platform 106(1), positioned within the interior region 104, that is configured to couple with a radio 108 such that the platform 106(1) can be remotely rotated in an X-axis direction, a Y-axis direction, and/or a Z-axis direction via one or more motors or actuators located within the platform 106(1) or coupled to the platform 106(1). The system 100 also includes at least one controller 110 that may transmit commands (e.g. movement or actuation commands) to the platform 106(1) and, upon receiving the commands, the platform 106(1) may operate accordingly by performing an actuation of one or more motors. For example, the platform 106(1) may execute a movement to rotate the radio 108 in an X-axis direction, a Y-axis direction, or a Z-axis direction. In some embodiments, the system 100 may include one or more cameras 112 to capture imagery of the testing of the radio 108 which may be controlled and processed by the controller 110 to generate further actuation commands for causing the platform 106(1) to dynamically move in response to information displayed by a UE 124 (e.g. on a screen or touch screen of the device) or to move in response to information obtained from the UE 124 while under test. For example, the system 100 may be configured to monitor voice calls, to transmit and receive data (messages, videos, music, etc.), operate applications, and perform other operations while the radio 108 or UE 124 are being rotated and to adjust the positioning of the devices as the monitored feature changes. In some embodiments, the system 100 may also include one or more light sources 114 in order to illuminate the interior region 104 of the radio signal absorption enclosure 102.

In some embodiments the system 100 may include a heating, ventilation and air-conditioning (HVAC) system 116 and vents 118 for controlling the environmental conditions within the radio signal absorption enclosure 102. For instance, when the doors of the radio signal absorption enclosure 102 are closed and the devices (e.g., the radio 108, the controller 110, and the UE 124) are operational, the temperature inside of the of the radio signal absorption enclosure 102 may increase to the point where the devices are no longer operational. Accordingly, the tester may control the temperature inside of the radio signal absorption enclosure 102 to test how the radio 108 and the UE 124 perform at certain temperatures and/or to ensure that a temperature remains constant throughout the testing protocol.

The system 100 may also include a power supply 122 which powers at least one of the platforms 106(1) and 106(2), the radio 108, the controller 110, or the UE 124. For example, in the illustrated embodiment, the power supply 122 is shown as being routed to the controller 110 and, in such an embodiment, one or more actuation control cables may be routed from the controller 110 to at least one of the platforms 106(1) and 106(2), the radio 108, the controller 110, or the UE 124 to transmit actuation commands and/or power to the devices. The system 100 may also include a communication channel 126 that enables a user terminal (e.g. shown in FIG. 4) to communicate with at least one of the platforms 106(1) and 106(2), the radio 108, the controller 110, or the UE 124.

As illustrated, the system 100 may include a filter 120 positioned within the interior region 104 that enables a tester to connect different elements and filaments from the exterior of the radio signal absorption enclosure 102 to the devices within the interior region 104 while filtering out any unwanted frequencies from the interior region 104. For example, the filter 120 may receive electro-magnetic (EM) energy from a power source outside of the radio signal absorption enclosure 102 that includes both power transmission frequencies (e.g. 120-volt power alternating at 60 Hz) and communications frequencies (e.g. power-line communication (PLC) signal data or absorbed RF-energy). In terms of lowering potential interference and increasing repeatability of testing conditions, the filter 120 may readily transmit the power transmission frequencies into the radio signal absorption enclosure 102, for example, to one or both of the platforms 106(1) and 106(2), the radio 108, the controller 110, or the UE 124. In some embodiments, the filter 120 filters high-frequency energy out of the EM-energy while transmitting low-frequency energy into the radio signal absorption enclosure 102 to power internal componentry. High-frequency energy may be defined as energy above a predetermined frequency threshold while low-frequency energy may be defined as energy below the predetermined threshold. For example, any EM energy above/below 100 Hz (or 60 Hz for that matter) may be defined as high-frequency/low-frequency energy, respectively. The filter 120 may include an interior panel which may contain one or more SMA (male or female) type connectors, one or more ethernet ports, one or more USB ports, and/or one or more QMA type connectors. In some instances, the filter 120 may include one or more signal line filters configured to reduce electro-magnetic interference and/or radio frequency interference associated with an Ethernet input or LAN input to the system 100.

In some embodiments, the radio signal absorption enclosure 102 may be opened at one or more locations in order to access various portions of the interior region 104. For example, front doors 128(1) and 128(2) may be pivoted into an open position to provide access to the interior region 104.

Figure 2:
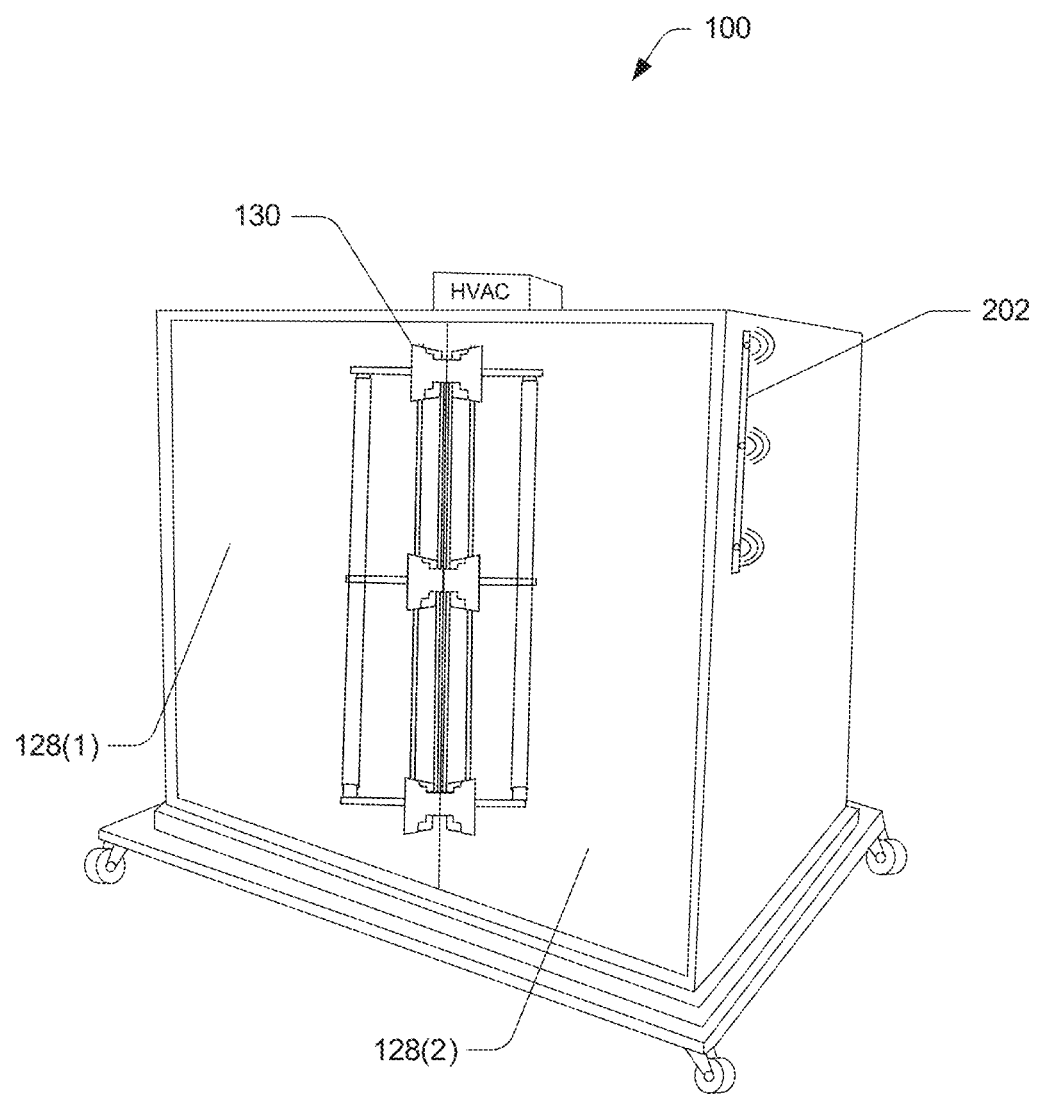
FIG. 2 illustrates the exemplary radio signal absorption enclosure testing system shown in FIG. 1 with doors thereof in closed positions to shield an interior region of the testing system.

Referring now to FIG. 2, the front doors 128(1) and 128(2) may be pivoted into a closed position to shield the radio 108 from ambient RF energy propagating through an exterior region that is outside of the radio signal absorption enclosure 102. Additionally, the front doors 128(1) and 128(2) may be pivoted into a closed position to shield the tester from frequencies emitted from the radio 108 that may fall in a frequency band determined to be harmful to humans. For example, the radio 108 may include a 5G New Radio (NR) broadcasting a 5G network and may emit radio waves at a frequency on a "millimeter" level of 30 gigahertz or higher (also referred to as millimeter band, millimeter wave, mmWave, MMW or mmW). When the front doors 128(1) and 128(2) are pivoted into a closed position, the radio signal absorption enclosure 102 may shield the tester from these high-level frequency waves, which may be harmful to humans in long exposure times, in additional to reducing interference inside the radio signal absorption enclosure 102, as discussed herein.

In some embodiments, the system 100 may include an automated locking mechanism 130 that is configured to prevent the radio signal absorption enclosure 102 from being inadvertently opened while a testing protocol is being performed. For example, the locking mechanism 130 may be automatically engaged at the initiation of a testing protocol by a user from a user terminal. In some embodiments, the system 100 may be configured to detect whether the locking mechanism 130 is currently engaged and respond by taking various actions such as delaying an initiation of a testing protocol until the locking mechanism is engaged. For example, if a user attempts to initiate a testing protocol when the front doors 128(1) or 128(2) are open, the system 100 may then notify the user that the door is ajar and wait until the door is closed and the locking mechanism 130 engaged before initiating the testing protocol. Additionally, in some embodiments, the system 100 may include indicator lights 202 that are configured to indicate when a test is being performed. For example, after both the front doors 128(1) and 128(2) are closed and the radio 108 is under test, the indicator light 202 may illuminate red to indicate that a test is being performed and it may be unsafe to open the front doors 128(1) and 128(2). Once the radio 108 is no longer under test and/or is turned off, the indicator lights 202 may illuminate green to indicate that the front doors 128(1) and 128(2) may be opened and that the testing has concluded.

Figure 3:
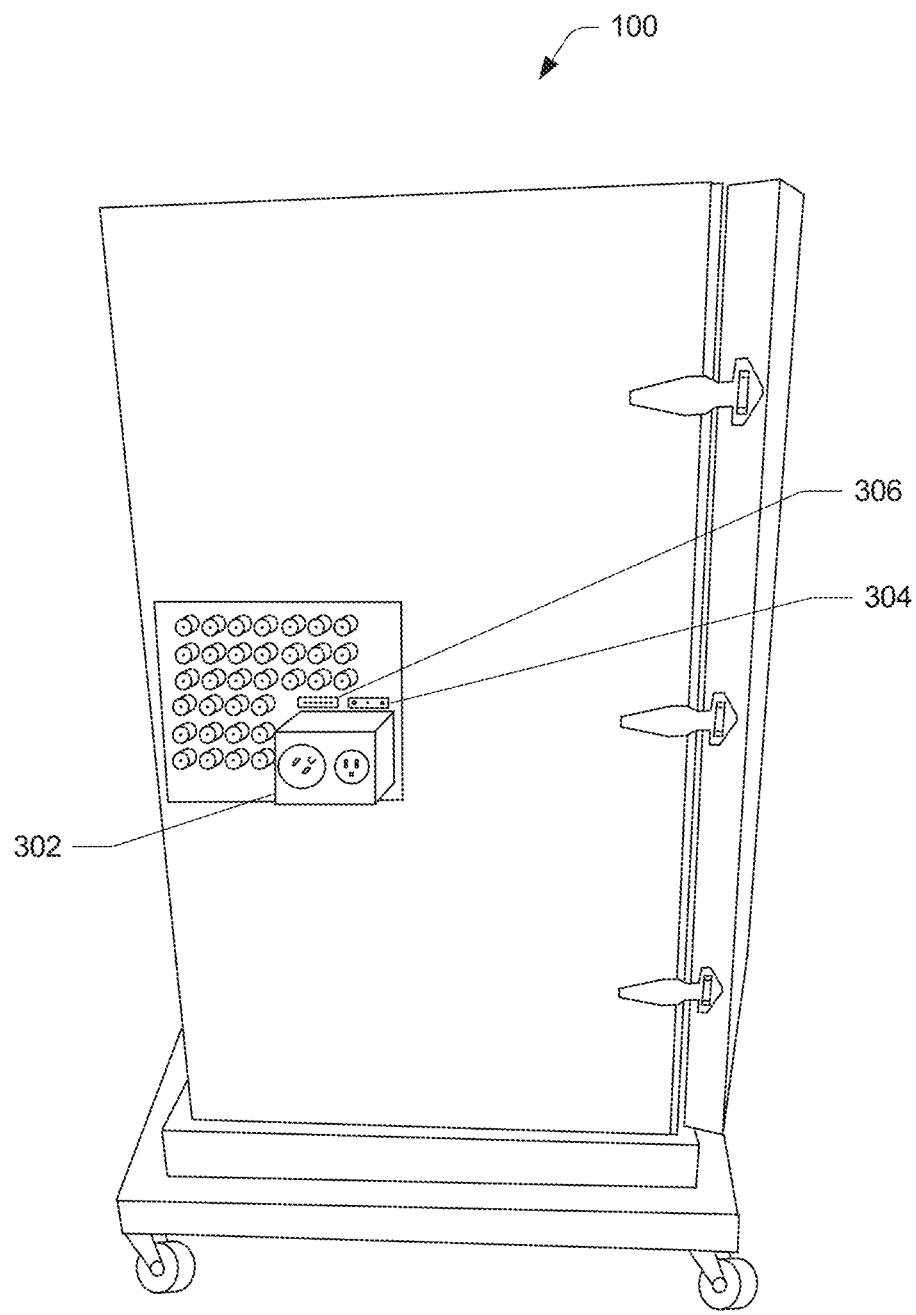
FIG. 3 illustrates a side view of the exemplary radio signal absorption enclosure testing system shown in FIG. 1 that includes various system input ports.

Referring now to FIG. 3, in some embodiments, the system 100 may include various input ports of the filter 120. In some embodiments, the system 100 may include one or more power inputs 302 which may be configured to accept power inputs of varying voltage and/or current. For example, in the illustrated embodiment the power input 302 includes two power input ports with one being configured to accept 120-volt power and the other being configured to accept 240-volt power. In some examples, the one or more power inputs 302 may be configured to receive a direct current voltage and current. In some embodiments, the system 100 may include one or more communication ports. For example, communication ports 304 and 306 may enable the communication channel 126 connect to a user terminal and may include any one of a USB port, an ethernet port, a firewire port, fiber port, RF port, or the like. Moreover, the various internal end connectors described and shown with relation to FIG. 1 may each have a corresponding external connection port as shown in FIG. 3. For example, the SMA type connectors and/or the QMA type connectors may protrude from the interior region to the exterior region.

Figure 4:
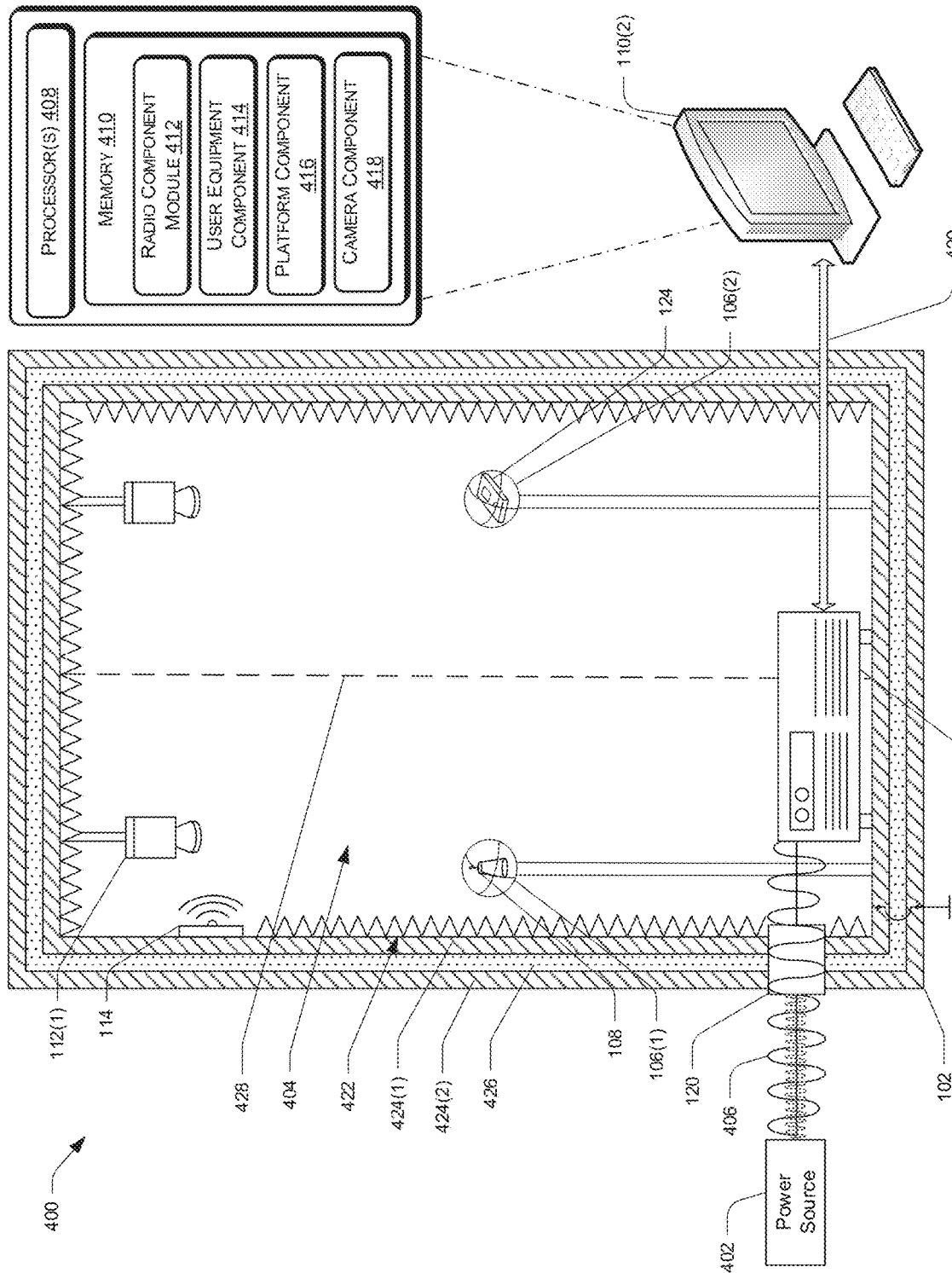
FIG. 4 is an illustrative system including platforms within a multi-layered radio signal absorption enclosure, a filter, and a user terminal that is communicatively coupled to a controller positioned within the radio signal absorption enclosure, in accordance with embodiments of the disclosure.

Referring now to FIG. 4, an illustrative system 400 includes a radio signal absorption enclosure 102 comprising the platforms 106(1) and 106(2), the radio 108, the UE 124, the controller 110(1), the cameras 112(1) and 112(2), the lights 114, and the filter 120. The filter 120 may be configured to connect different elements and filaments from the exterior of the radio signal absorption enclosure 102 to the devices within the interior region 404 while filtering out any unwanted interference (e.g., electro-magnetic interference and/or radio-frequency interference) that may be present at the time of testing. The filter 120 may be configured to receive EM energy from a power source 402 and to filter out any portion of the received EM energy which is not optimized for power transmission and which may cause unnecessary interference with tests if passed through to the interior region 404 of the radio signal absorption enclosure 102. For example, electrical power transmission lines are generally designed to transmit power at 50 Hz or 60 Hz from one location to another location. At these power transmission frequencies, a first portion of the EM energy 406 may transmit power efficiently with little of the EM energy being radiated out of the cables as ambient RF energy which may potentially interfere with testing of the radio 108 and the UE 124. Therefore, based on this portion of the EM energy being at one of these transmission frequencies, or within a predetermined range around these frequencies, the filter 120 may transmit that portion into the interior region 404 to power the platforms 106(1) and 106(2), the radio 108, the UE 124, the controller 110(1), the cameras 112(1) and 112(2), and the lights 114. As discussed herein, the filter 120 may include one or more of a bandpass filter, low-pass filter, a high-pass filter, and the like configurable based on characteristics of a signal intended to be passed into the interior region 404.

Other portions of the EM energy may, however, be carried through the power transmission lines at frequencies which the lines were not designed to carry energy at. For example, although typical power transmission lines are not designed to carry RF energy, RF energy nevertheless is often carried through these lines both intentionally and inadvertently. Moreover, the amount of EM energy that is radiated from the lines increases as a function of the frequency of the carrier-current of the energy. In particular, while little of the electrical power being transmitted in the roughly 50 Hz to 60 Hz range will be radiated out of the lines, a signal being carried at 100 kHz will have a great amount of the signal radiated out of the line as RF energy, in which case the radiated amount may be a source of potential interference with testing of the radio 108 and the UE 124. One example, of communication frequency EM energy includes Power Line Communication (PLC) data signals such as, for example, those used by the electric-utility industry to send commands to, and thereby control, certain electrical equipment. Generally, PLC commands are transmitted at frequencies less than 490 kHz; however, such frequencies may still radiate a significant portion of the signal out of the line as RF energy and cause interference with surrounding radio equipment such as the radio 108 and the UE 124. This type of PLC data signal energy is illustrated in FIG. 4 as the light gray line of low amplitude (as compared to the other illustrated waveform).

In some embodiments, the system 400 can include a faraday cage to further reduce electro-magnetic interference and radio frequency interference from reaching the interior region 404.

As illustrated in FIG. 4, the controller 110(1) may be equipped with one or more processor(s) 408 and memory 410. The memory 410 may include applications, components, and/or data. In some embodiments, the memory 410 may include a radio protocol component 412, a UE component 414, a platform component 416, and a camera component 418, among other possible modules that enable the controller 110(1) to interact with the platforms 106(1) and 106(2), the radio 108, the UE 124, and the cameras 112(1) and 112(2), and thereby perform test scenarios on the radio 108 and the UE 124.

The radio protocol component 412 may generate and transmit instructions that cause the radio 108 to broadcast a network such that the UE 124 may operate on the network. For example, the radio protocol component 412 may be coupled to the radio 108 through one or more of the end connectors shown in FIGS. 1 and 3, e.g. the SMA type end connectors, to enable the radio 108 to function as an RF base station for testing one or more of the functionalities or features of the UE 124 under test. The radio protocol component 412 may cause the radio 108 to function as a 5G NR and the radio protocol component 412 may enable a tester to set the 5G NR to broadcast radio signals of a specific frequency, such as a frequency on a millimeter level of 30 gigahertz or higher. In some embodiments, the radio protocol component 412 may generate and transmit instructions to cause the radio 108 to receive signal data representing a RF signal transmitted from the UE 124. The radio protocol component 412 may then store the signal data in the memory 410 of the controller 110(1). In some examples, the signal data may indicate a signal strength at which the UE 124 receives the broadcasted network.

In some instances, the radio protocol component 412 may be configured to control one or more of a $3^{rd}$ Generation (3G) base station, a $4^{th}$ Generation (4G) base station, a $5^{th}$ Generation (5G) base station, a dual-connectivity base station or base station system (e.g., configured to communicate in accordance two or more 3G, 4G, or 5G protocols).

The UE component 414 may generate and transmit instructions that cause the UE 124 to perform operations while under test in the radio signal absorption enclosure 102. For example, the UE component 414 may cause the UE 124 to turn on, access a network broadcast by the radio 108 (e.g., a 5G network), and perform operations such as, but not limited to, initiating voice calls, transmitting and receiving data (messages, videos, music, etc.), executing applications, browsing the Internet, and performing other operations. In some examples, the UE component 414 may cause the UE 124 to transmit an RF signal to be received by the radio 108. The RF signal may include a signal strength at which the UE 124 receives the broadcasted network. In some instances, the UE component 414 can be configured to receive measurement data associated with the RF signal received by the UE, such as frequency, signal strength, signal-to-interference-plus-noise ratio (SINR), and the like.

The platform component 416 may control movements of the platforms 106(1) and 106(2), which, when coupled with the radio 108 and the UE 124, may cause the radio 108 and the UE 124 to be rotated in any direction (e.g., X-axis direction, Y-axis direction, or Z-axis direction), raised, or lowered, and the like. In some examples, the platform component 416 may store information related to a position of the radio 108 and the UE 124, such as, but not limited to, angle, height, distance apart from one another, etc.

The camera component 418 may control movement and operations of the cameras 112(1) and 112(2), which may include rotation of the cameras 112(1) and 112(2) and which may further include causing the cameras 112(1) and 112(2) to capture images of the radio 108, the UE 124, and the controller 110. In some examples, the camera component 418 may store the images captured by the cameras 112(1) and 112(2).

Furthermore, the controller 110(1) may include multiple components with some inside and some outside of the radio absorption enclosure 102. In some embodiments, the controller may include both an actuation controller 110(1) for transmitting commands to the devices (e.g., the radio 108, the platforms 106(1) and 106(2), and the UE 124) and a user terminal 110(2) for displaying information associated with the testing. In accordance with various embodiments, the user terminal 110(2) may include a monitor, which may display a user interface (UI) to enable the user to interact with the various modules of the memory 410. In accordance with some embodiments, the system 400 may be configured to display on a GUI, e.g. the monitor of user terminal 110(2), substantially live image data received from the cameras 112(1) and 112(2) while testing is being performed within the radio signal absorption enclosure 102 during the performing the testing protocol.

The controller 110(1) may be positioned either in the interior or in the exterior of the radio signal absorption enclosure 102. In some embodiments, the controller 110(1) can be positioned within the interior region 404 of the radio signal absorption enclosure 102 and can be communicatively coupled to the user terminal 110(2) via a communication channel 430. The communication channel 420 may be an optical fiber (e.g. as depicted in FIG. 4) to limit the electrical signal current transmitted within the interior region 404. In particular, transmitting information as pulses of light does not emit RF radiation and may be less susceptible to RF interference. In some embodiments, the communication channel 420 may include a conductive wire type connection, e.g. a wire configured to transmit data via electric pulses such as a USB cable, or a wireless communication link between an RF antenna within the interior region 404 and the controller 110(1).

In some embodiments, the interior region 404 may be lined with an RF absorbing material 422 to minimize internal reflection of RF energy within the interior region 404, e.g. RF energy which penetrated the enclosure and/or RF energy generated internal to the enclosure such as by the radio 108, UE 124, or controller 110(1). Exemplary RF absorbing materials include, but are not limited to, ferrite-loaded rubber and/or carbon-loaded foam. Furthermore, in various embodiments, the RF absorbing material 422 may include numerous peaks to form an "egg-crate" type shape, a triangular type shape, and/or a pyramidal type shape to further assist in scattering and dissipating internal RF energy.

In some embodiments, the multi-layered shielded enclosure 102 may include two or more conductive layers 424 for providing suitable isolation at relevant frequencies. Conductive layers 424 may be made from any material suitable for shielding the relevant frequencies of RF energy such as, for example, aluminum, copper, or steel. Furthermore, the conductive layers 424 may designed to provide substantial shielding effectiveness such as, e.g. higher than 60 dB or higher than 80 dB. In some embodiments, the conductive layers 424 may be flexible in nature (as opposed to rigid) such as a cloth material embedded with stainless steel as the RF carrier material used to absorb and/or shield RF energy. In some embodiments, the conductive layers 424 may be a solid metallic sheet material, e.g. an aluminum sheet metal. In some embodiments, the conductive materials 424 may be separated by an insulator 426 such as, for example, a non-conductive foam or an air gap. Conductive layers 424 may function as a Faraday cage to block external signals from entering the interior region 404 and to prevent interference during testing of radio 108 and/or UE 124. In some embodiments, the conductive materials 424 may be connected to a ground path to enable dissipation of any absorbed energy.

In some embodiments, the radio signal absorption enclosure 102 may include an adjustable divider 428 between platform 106(1) and platform 106(2) such that the tester may determine the effects of the divider 428 on the communication between the radio 108 and the UE 124. For example, the divider 428 can be controlled to block a signal between the radio 108 and the UE 124 to simulate dropped calls.

Figure 5:
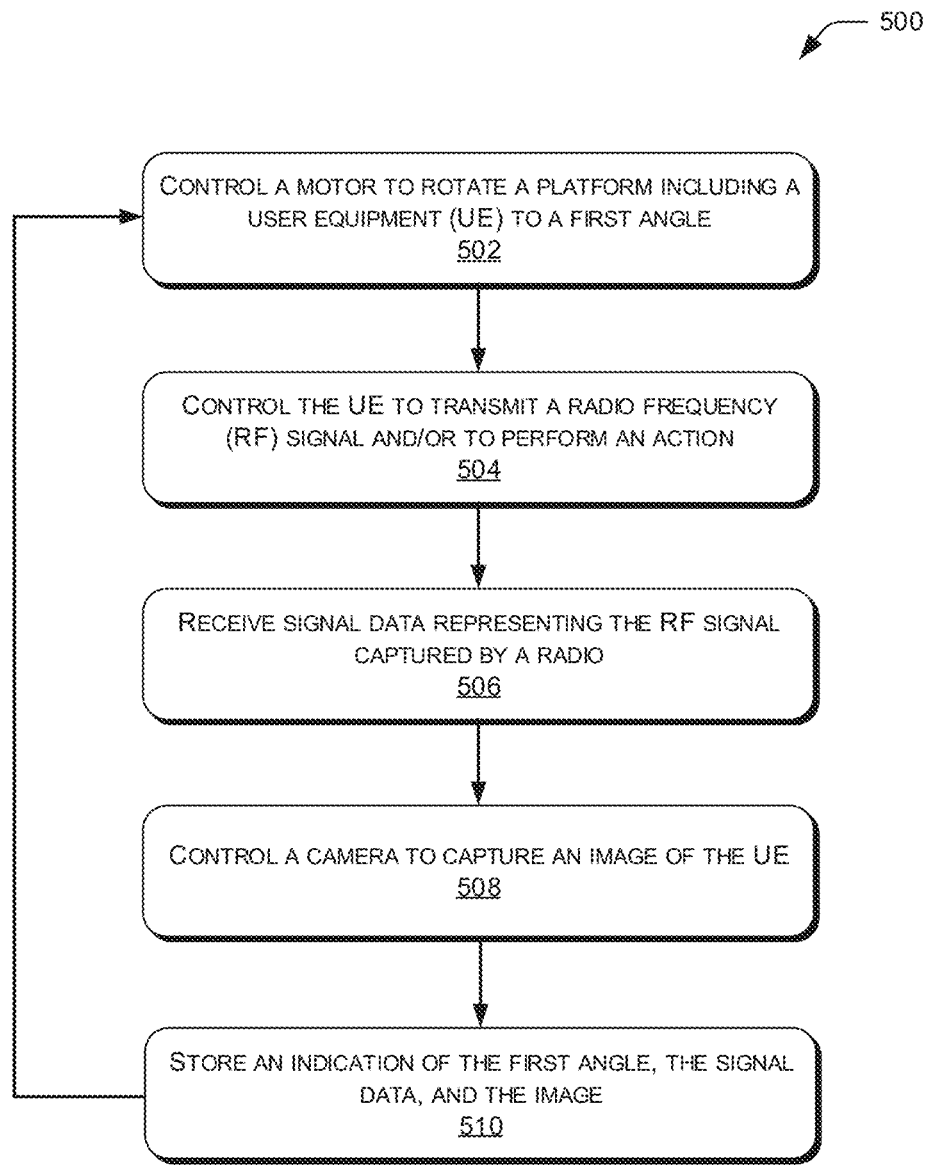
FIG. 5 is a flow diagram of an illustrative process of a controller capturing radio signal data from a user equipment (UE) while the UE is securely enclosed within a radio signal absorption enclosure, in accordance with embodiments of the disclosure.

FIG. 5 illustrates example a process in accordance with embodiments of the disclosure. This process is illustrated as a logical flow graph, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process.

FIG. 5 is a flow diagram of an illustrative process 500 of a controller capturing RF signal data from a UE while the UE is securely enclosed within a radio signal absorption enclosure, in accordance with embodiments of the disclosure. The example process 500 can be performed by the controller 110 in conjunctions with the radio 108 and/or the UE 124, in connection with other components discussed herein. Some or all of the process 500 can be performed by one or more devices, equipment, or components illustrated in FIGS. 1-4, for example.

At operation 502, the controller may control a motor to rotate a platform including a UE to a first angle. In some embodiments, a platform module of the controller may control movements of a platforms coupled with the UE and may cause the UE to be rotated in any direction (e.g., X-axis direction, Y-axis direction, or Z-axis direction), raised, or lowered, and the like. In some cases, the UE may be under test of new technologies, such as Beamforming.

At operation 504, the controller may control the UE to transmit an RF signal and/or to perform an action. For example, a UE module of the controller may cause the UE to turn on, access a network broadcast by a radio (e.g., a 5G network), and perform operations such as, but not limited to, initiating voice calls, transmitting and receiving data (messages, videos, music, etc.), running applications, browsing the Internet, and performing other operations. In some examples, the UE module may cause the UE to transmit an RF signal to be received by the radio. The RF signal may include a signal strength at which the UE receives the broadcasted network. In some examples, the operation 504 can further include controlling the radio 108 to communicate with the UE 124 using a particular frequency, polarization, and/or communication technology (e.g., 3G, 4G, or 5G). In some cases, the controller may control the UE to attach to a gNB broadcasting mmWave signals and/or to execute instructions such as test cases.

At operation 506, the controller may receive signal data representing the RF signal captured by a radio. For example, a radio protocol module of the controller may generate and transmit instructions to cause the radio to receive signal data representing a RF signal transmitted from the UE. The radio protocol component 412 may then store the signal data in the memory 410 of the controller 110(1). In some examples, the signal data may indicate a signal strength at which the UE 124 receives the broadcasted network. In some examples, the operation 506 can include the controller receiving signal data representing a RF signal captured by the UE and broadcast by the radio.

At operation 508, the controller may control a camera to capture an image of the UE. For example, a camera module may control movement and operations of the cameras, which may include rotation of the cameras and causing the cameras to capture images of the radio, the UE, and the controller. In some cases, the controller may also control the camera to capture an image of the radio.

At operation 510, the controller may store an indication of the first angle, the signal data, and the image. For example, the platform component 416 may store information related to a position of the radio and the UE, such as, but not limited to, angle, height, distance apart from one another, etc. The camera module may store the images captured by the cameras. The radio protocol module may store the signal data and, in some examples, the signal data may indicate a signal strength at which the UE receives the broadcasted network.

In some instances, the process 500 can be performed iteratively to substantially exhaustively test combinations of frequencies, actions, orientations, and the like available to test for a radio and/or UE. Accordingly, the systems, devices, and techniques discussed herein can efficiently and safely test a variety of devices in a repeatable manner.

Although the subject matter has been described in language specific to structural features and/or methodological acts, it is to be understood that the subject matter defined in the appended claims is not necessarily limited to the specific structural features or acts described. Rather, the specific structural features and acts are disclosed as exemplary forms of implementing the claims. The scope of the present disclosure and appended claims is not limited by these exemplary forms. Numerous variations, whether explicitly provided for by the specification or implied by the specification, such as variations in structure features and/or methodological acts, whether now known in the art or subsequently developed, may be implemented by one of skill in the art in view of this disclosure.

What is claimed is:

1. A device testing system comprising:
    an enclosure to absorb radio-frequency (RF) signals emitted from a 5th Generation (5G) radio that is within an interior of the enclosure;
    a first platform positioned within the interior of the enclosure and extending from a floor of the enclosure, the first platform being configured to couple with the 5G radio and to be rotatable;
    at least one filter configured to couple with a user equipment (UE) that communicates with the 5G radio within the interior of the enclosure, the UE being configured to couple with a second platform positioned within the interior of the enclosure and extending from the floor of the enclosure; and at least one door configured to allow access to the interior of the enclosure.

2. The device testing system of claim 1, wherein the enclosure is configured to absorb millimeter Wave (mm-Wave) frequencies emitted from the 5G radio.

3. The device testing system of claim 1, further comprising at least one of an HVAC system or a ventilation system.

4. The device testing system of claim 1, further comprising at least one camera positioned within the interior of the enclosure, the at least one camera being configured to captured image data representing a portion of the interior of the enclosure.

5. The device testing system of claim 1, wherein the interior of the enclosure is lined with a material configured to absorb the RF signals within a frequency range of approximately 600 MHz to 70 GHz.

6. The device testing system of claim 1, wherein the at least one filter includes at least one of:
a fiber port;
a SMA connector;
an AC/DC power filter;
an ethernet connector; or
a USB port.

7. The device testing system of claim 1, further comprising a controller configured to control a motor coupled to the first platform and to associate a position of the first platform with signal data received from the UE.

8. An apparatus comprising:
an enclosure lined with a material for absorbing radio-frequency (RF) signals emitted from a radio that is within an interior of the enclosure;
a first camera positioned to capture first image data of the radio;
a platform positioned within the interior of the enclosure, the platform being configured to couple with the radio and to be rotatable;
a motor or actuator configured to rotate the platform;
at least one filter configured to couple with a user equipment (UE) that communicates with the radio within the interior of the enclosure;
a second camera positioned to capture second image data of the UE; and
at least one door configured to allow access to the interior of the enclosure.

9. The apparatus of claim 8, wherein the platform is a first platform and wherein the apparatus further comprises a second platform being figured to couple with the UE and to be rotatable.

10. The apparatus of claim 9, further comprising a divider located between the first platform and the second platform, the divider being configured to selectively block RF signals being transmitted from the radio to the UE.

11. The apparatus of claim 8, wherein the material comprises one or more of a ferrite-loaded rubber or a carbon-loaded foam.

12. The apparatus of claim 8, wherein the material is configured to absorb the RF signals within a frequency range of approximately 600 MHz to 70 GHz.

13. The apparatus of claim 8, wherein the at least one filter is configured to receive a control signal associated with the UE and to generate a filtered control signal to transmit to the UE.

14. The apparatus of claim 8, wherein the radio comprises a 5G New Radio broadcasting a 5G network emitting radio waves at a frequency on a millimeter level of at least 24 gigahertz.

15. The apparatus of claim 8, further comprising an adjustable divider between the radio and the UE.

16. The apparatus of claim 8, further comprising a controller located within the interior of the enclosure and being accessible from an exterior of the enclosure, the controller being configured to perform at least one of causing the at least one platform to rotate, causing at least one of the first camera or the second camera located within the interior of the enclosure to capture the first image data or the second image data, capturing radio signal information received from the radio, or causing the UE to perform an action.

17. An enclosure comprising:
an interior housing a 5th Generation (5G) radio;
a first platform positioned within the interior of the enclosure and extending from a floor of the enclosure, the first platform being configured to couple with the 5G radio and to be rotatable;
at least one filter configured to couple with a user equipment (UE) that communicates with the 5G radio within the interior of the enclosure, the UE being configured to couple with a second platform positioned within the interior of the enclosure and extending from the floor of the enclosure; and
at least one door configured to allow access to the interior of the enclosure.

18. The enclosure of claim 17, further comprising an HVAC system.

19. The enclosure of claim 17, further comprising a divider located between the 5G radio and the UE, the divider comprising a ferrite-loaded rubber.

20. The enclosure of claim 17, further comprising an autonomous locking mechanism configured to delay an initiation of a testing protocol in response to being unlocked.

* * * * *